(12) United States Patent
Brandes et al.

(10) Patent No.: US 6,680,489 B1
(45) Date of Patent: Jan. 20, 2004

(54) AMORPHOUS SILICON CARBIDE THIN FILM COATING

(75) Inventors: George R. Brandes, Southbury, CT (US); Chris S. Christos, Brookfield, CT (US); Xueping Xu, Stamford, CT (US)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

(21) Appl. No.: 09/557,165

(22) Filed: Apr. 25, 2000

Related U.S. Application Data

(60) Continuation-in-part of application No. 09/461,693, filed on Dec. 14, 1999, now Pat. No. 6,268,229, which is a division of application No. 08/575,484, filed on Dec. 20, 1995, now Pat. No. 6,031,250.

(51) Int. Cl.[7] .......................................... H01L 31/0312
(52) U.S. Cl. ........................ 257/77; 257/76; 438/105
(58) Field of Search ................... 257/76, 77; 438/105, 438/931

(56) References Cited

U.S. PATENT DOCUMENTS

| | | | |
|---|---|---|---|
| 3,789,471 A | 2/1974 | Spindt | |
| 4,329,699 A | 5/1982 | Ishihara et al. | |
| 4,412,900 A | 11/1983 | Tanaka et al. | |
| 4,414,693 A | * 11/1983 | Brody | ............... 2/435 |
| 4,695,853 A | 9/1987 | Hackelman et al. | |
| 4,857,161 A | 8/1989 | Borel et al. | |
| 4,937,454 A | 6/1990 | Itoh et al. | |
| 4,940,916 A | 7/1990 | Borel et al. | |
| 5,011,706 A | * 4/1991 | Tarhay et al. | ............... 427/573 |
| 5,061,322 A | * 10/1991 | Asano | ............... 136/258 |
| 5,075,591 A | 12/1991 | Holmberg | |
| 5,140,397 A | 8/1992 | Haga et al. | |
| 5,142,184 A | 8/1992 | Kane et al. | |
| 5,159,430 A | 10/1992 | Manning et al. | |
| 5,232,865 A | 8/1993 | Manning et al. | |
| 5,283,500 A | 2/1994 | Kochansk | |
| 5,350,490 A | 9/1994 | Lee et al. | |
| 5,449,970 A | 9/1995 | Kumar et al. | |
| 5,608,283 A | 3/1997 | Twichell et al. | |
| 6,031,250 A | 2/2000 | Brandes et al. | |

FOREIGN PATENT DOCUMENTS

| | | | | |
|---|---|---|---|---|
| FR | 2650119 | | 1/1991 | |
| JP | 62193172 A | * | 8/1987 | .......... 257/E27.141 |
| JP | 62252968 A | * | 11/1987 | ................. 257/53 |
| JP | 63084075 A | * | 4/1988 | ................. 136/258 |
| JP | 03197676 A | * | 8/1991 | ............. 427/163.1 |
| WO | PCT/US99/17784 | * | 11/2000 | ........... C03C/17/22 |

OTHER PUBLICATIONS

E. W. Brass, "Small Silicon Carbide Non–Linear Resistors: Aspects of Rating and Their Application to Spark Suppression", Electronic Engineering, (Dec. 1968), pp. 660–667.

E. C. Sakshaug, A Brief History of AC Surge Arresters IEEE Power Engineering Review, (Aug. 1991), pp. 11–13,40.

S. Komatsu, et al., "Preparation and Characterization of Reactively Sputtered $SiC_xN_y$ Films", Thin Solid Films, vol. 193/194. (1990) p. 917–923.

Takeshi Nagai, et al., "SiC Thin Film Thermistor", Thin Solid Films, vol. 125, (Oct. 11, 1984), pp. 355–359.

* cited by examiner

*Primary Examiner*—Nathan J. Flynn
*Assistant Examiner*—Scott R Wilson
(74) *Attorney, Agent, or Firm*—Margaret Chappnis; Steven J. Hultquist

(57) ABSTRACT

Amorphous silicon carbide thin film structures, including: protective coatings for windows in infrared process stream monitoring systems and sensor domes, heated windows, electromagnetic interference shielding members and integrated micromachined sensors; high-temperature sensors and circuits; and diffusion barrier layers in VLSI circuits. The amorphous silicon carbide thin film structures are readily formed, e.g., by sputtering at low temperatures.

10 Claims, 6 Drawing Sheets

AMORPHOUS SILICON CARBIDE THIN FILM COATING

CROSS-REFERENCE TO RELATED APPLICATIONS

This is a continuation-in-part of U.S. patent application Ser. No. 09/461,693 filed Dec. 14, 1999 now U.S. Pat. No. 6,268,229 in the names of George R. Brandes, et al. for "Integrated Circuit Devices and Methods Employing Amorphous Silicon Carbide Resistor Materials," which is a divisional application of U.S. patent application Ser. No. 08/575,484 filed Dec. 20, 1995 in the names of George R. Brandes, et al. for "Integrated Circuit Devices and Methods Employing Amorphous Silicon Carbide Resistor Materials," and issued on Feb. 29, 2000 as U.S. Pat. No. 6,031,250.

BACKGROUND OF THE INVENTION

1. Field of the Invention

The present invention generally relates to amorphous silicon carbide thin films and articles comprising amorphous silicon carbide thin films, as well as to methods of making and using the same.

2. Description of the Art

Silicon carbide (SiC) is an extremely hard, mechanically strong, and chemically inert ceramic material. Silicon carbide exhibits good oxidation resistance and corrosion resistance, high heat transfer coefficient compared to metals, low expansion coefficient compared to metals, high resistance to thermal shock and high strength at elevated temperatures.

Although silicon carbide has come into use as a wafer material for semiconductor device manufacturing, it has not been extensively utilized in a manner that reflects its commercial potential and variant properties.

The present invention is directed to novel applications of silicon carbide in the form of amorphous silicon carbide thin films.

SUMMARY OF THE INVENTION

The present invention relates to amorphous silicon carbide thin films in a variety of products and end use applications, in which the physical, chemical, electrical and/or optical properties of amorphous silicon carbide are utilized to advantage.

In one aspect, the present invention relates to an article comprising an amorphous silicon carbide thin film on a structure selected from the group consisting of:

- substrates that are transmissive to at least one of light and infrared radiation;
- structures adversely affected by exposure to radio frequency and/or microwave radiation thereon;
- shielding members for protection of structures adversely affected by exposure to radio frequency and/or microwave radiation thereon;
- structures susceptible to chemical attack and/or thermal degradation in their end use environments; and
- electronic circuitry structures susceptible to diffusional release and/or diffusional receipt of atomic species in use thereof.

Another aspect of the invention relates to a window assembly, comprising:
- a window; and
- an optically transparent thin film of amorphous silicon carbide on a surface of said window.

In a further aspect, the invention relates to a window assembly, comprising:
- a window;
- an optically transparent and electrically conductive thin film of amorphous silicon carbide deposited on a surface of said window; and
- a power supply operatively coupled to the thin film, and selectively actuatable so that the power supply when actuated causes an electrical current to flow through the thin film to generate heat, whereby the window may be selectively defogged or de-iced.

Another aspect of the invention relates to an electromagnetic interference shielded assembly, comprising:
- a structure disposed in protective relationship to a region to be shielded; and
- an electrically conductive thin film of amorphous silicon carbide on at least a portion of said structure.

A further aspect of the invention relates to a sensor assembly, comprising:
- a sensor; and
- an amorphous silicon carbide thin film on at least part of the sensor.

Yet another aspect of the invention relates to a sensor assembly, comprising:
- a sensor including sensing element(s) formed of amorphous silicon carbide, whereby the sensor assembly is operable at temperatures up to 1000° C.

In another aspect, the invention relates to a high-temperature sensor assembly, comprising:
- a sensing element formed of amorphous silicon carbide; and
- electrical circuitry operatively coupled with the sensing element,
- said electrical circuitry comprising amorphous silicon carbide doped with at least one dopant selected from the group consisting of n-type and p-type dopants, whereby the sensor assembly is operable at temperatures up to 1000° C.

A further aspect of the invention relates to a high-temperature pressure sensor, comprising:
- a substrate including a reference cavity region;
- a first highly resistive amorphous silicon carbide thin film deposited on the substrate, but not the reference cavity region;
- a second highly resistive amorphous silicon carbide thin film deposited over the first highly resistive thin film, and additionally over the reference cavity region, to form a sealed reference cavity;
- a low resistivity amorphous silicon carbide thin film deposited over the second highly resistive thin film, over the region of the sealed reference cavity; and
- electrodes contacting the low resistivity amorphous silicon carbide thin film, and operatively coupled to a resistance-sensing electrical circuit,
- whereby changes in resistivity of the low resistivity amorphous silicon carbide thin film incident to changes in strain in the low resistivity amorphous silicon carbide thin film are sensed by the resistance-sensing circuit.

Another aspect of the invention relates to a VLSI circuit assembly, comprising:
- a VLSI electronic circuit including an active circuit structure and a metalization interconnect layer; and
- a thin film of amorphous silicon carbide between the active circuit structure and the metalization layer, as a diffusion barrier against diffusion of atoms from the metalization layer into the active circuit structure.

In another aspect, the invention relates to a method of forming an article comprising an amorphous silicon carbide thin film, including deposition of the amorphous silicon carbide thin film by a process selected from the group consisting of chemical vapor deposition, plasma enhanced chemical vapor deposition, RF glow discharge, RF sputtering, ion cluster beam deposition, ion beam sputtering, sol gel coating, reactive sputtering, plasma spray, reactant spraying, microwave discharge, and photo CVD.

Other aspects, features and embodiments of the invention will be more fully apparent from the ensuing disclosure and claims.

DETAILED DESCRIPTION OF THE INVENTION, AND PREFERRED EMBODIMENTS THEREOF

Figure 1A:
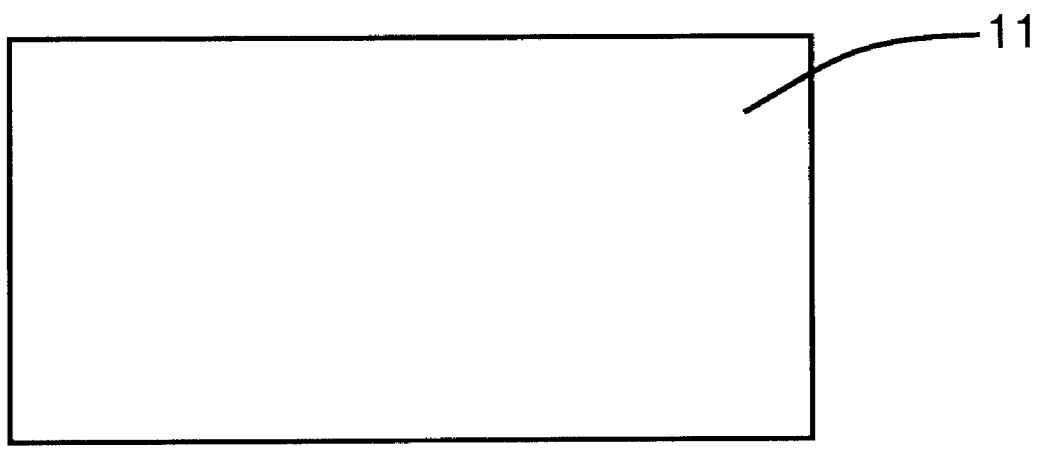
FIG. 1 is a schematic representation of a process of coating a window with a thin film of amorphous silicon carbide, according to one embodiment of the present invention.

As used herein, "thin film" refers to material layers having a thickness less than about 1,000 microns. Amorphous silicon carbide in the practice of the present invention refers to silicon carbide whose x-ray diffraction scans do not show the discrete sharp peaks of scattered radiation that are observed from crystalline or semicrystalline solids of silicon carbide. Amorphous silicon carbide is sometimes hereinafter identified as "a-SiC" for ease of reference.

The disclosure of U.S. Pat. No. 6,031,250 issued Feb. 29, 2000 in the names of George R. Brandes, et al. for "Integrated Circuit Devices and Methods Employing Amorphous Silicon Carbide Resistor," is hereby incorporated herein by reference in its entirety.

The features and advantages of the present invention are illustrated with reference to various specific embodiments hereinafter described. It will be recognized that the invention is not thus limited, but extends in utility to other embodiments, devices, assemblies and corresponding structures and methods, wherein amorphous silicon carbide thin film materials and structures are used to advantage.

The amorphous silicon carbide films of the present invention may be formed in any suitable manner, e.g., by sputtering in a sputter tool using either a beta silicon carbide target with argon sputter gas or a silicon target with a mixture of methane and argon sputter gas. Dopants, such as nitrogen, can be introduced in the films by adding a controlled amount (partial pressure) of the dopant gas into the sputter gas. Amorphous silicon carbide films produced in the practice of the present invention may be annealed up to a temperature of about 1100° C. to produce films that are optically transparent and chemically inert. The optically transparent amorphous silicon carbide films can attenuate optical or infrared radiation compared to the uncoated window, but the transmitted signal will be detectable.

In one embodiment, the present invention contemplates the deposition of amorphous silicon carbide coatings on conventional infrared windows in infrared spectroscopy process stream monitoring and analysis systems, to reduce chemical reaction at the window surface and to fill window surface disparities. Amorphous silicon carbide is chemically inert and transparent over wide bands in the infrared region. The properties of a-SiC do not change over temperatures typically encountered in industrial chemical process streams or in subsequent cleaning stages of such processes.

Amorphous silicon carbide coatings for infrared windows in accordance with the present invention may be formed by any suitable deposition or film forming technique. Such techniques illustratively include chemical vapor deposition (CVD), plasma enhanced chemical vapor deposition (PECVD), RF glow discharge, RF sputtering, ion cluster beam deposition, ion beam sputtering, sol gel coating, reactive sputtering, plasma spray, reactant spraying, microwave discharge, and photo CVD. Preferably, low temperature deposition is employed to enable the selection of the window from a wide variety of window types.

Sputtering is a preferred coating process, which enables low substrate temperatures to be utilized and which produces a film that is smooth and fills window surface disparities. The sputtered coating layer of a-SiC may be formed with a thickness in the range from about 0.025 microns to about 10 microns, preferably in the range from about 0.05 microns to about 1.0 micron, and most preferably in the range from about 0.1 microns to about 0.5 microns. Substrate temperatures of less than 500° C. during deposition of silicon carbide produce amorphous films. Deposition at a substrate temperature of about 200° C. yields an advantageously large optical gap. Low temperature deposition processes are preferred, with the most preferable substrate temperature being in the vicinity of room temperature (30° C.) or below. At low substrate temperature, smoother films are obtained at lower pressures (15 milliTorr). A silicon carbide target is advantageously used for the sputtering formation of the amorphous silicon carbide film.

Figure 1B:
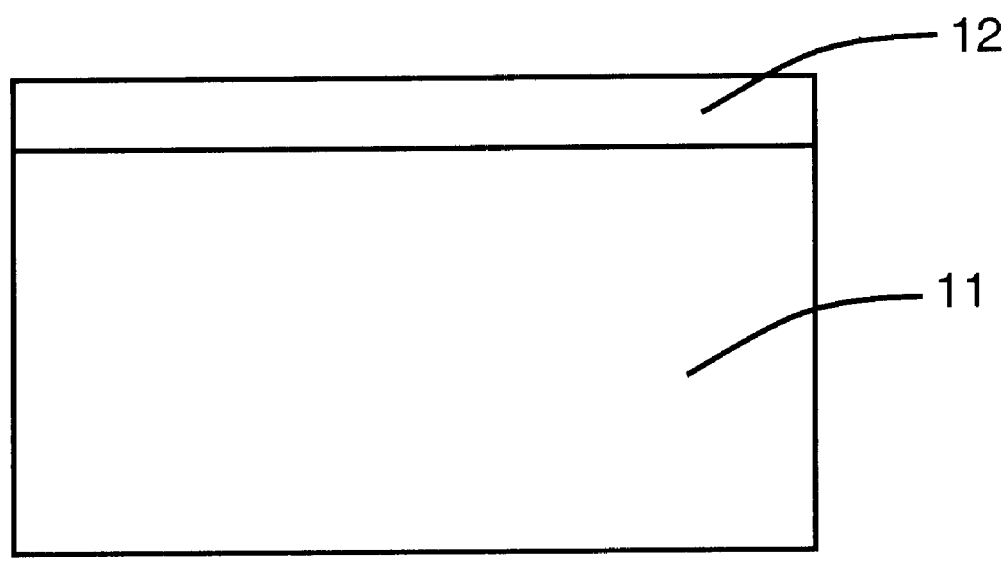

Referring now to the drawings, FIG. 1 schematically illustrates the steps used in fabricating a window coating, according to one embodiment of the present invention. FIG. 1a shows the IR window 11, or substrate, prior to deposition of the a-SiC film, and FIG. 1b shows the IR window 11 following deposition of the a-SiC film 12 thereon.

Figure 2A:
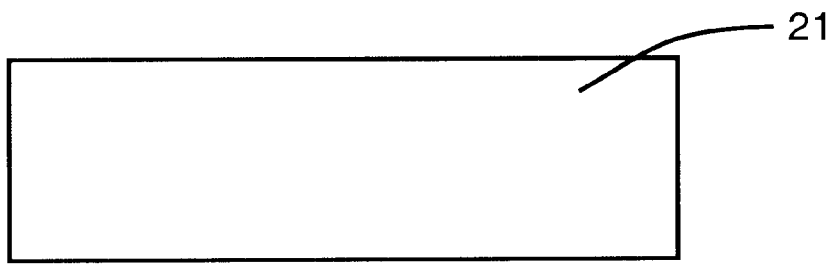
FIG. 2 is a schematic representation of a process of coating a window with a thin film of amorphous silicon carbide, additionally employing a glue layer, according to another embodiment of the present invention.
Figure 2B:
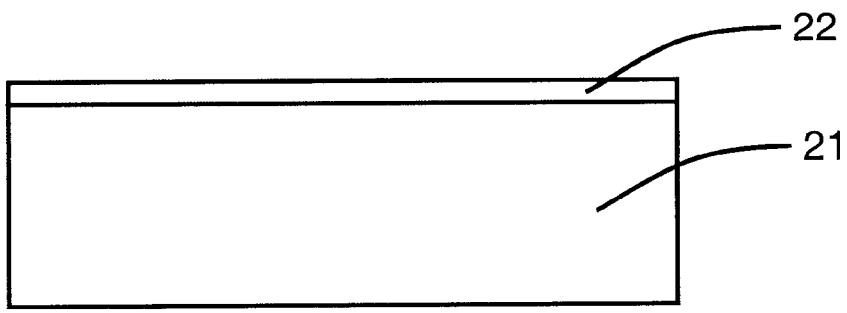
Figure 2C:
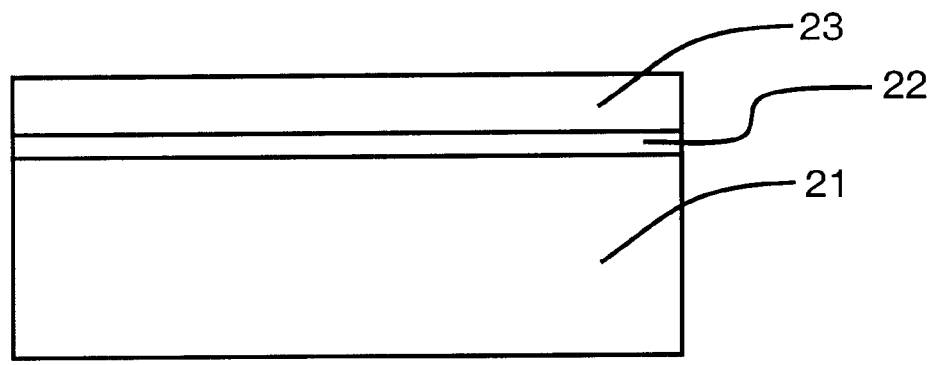

FIG. 2 schematically illustrates steps used in fabricating a coating of amorphous silicon carbide, according to another embodiment of the present invention. In FIG. 2a, the IR window 21 is shown following a cleaning step to prepare its surface, e.g., argon bombardment to remove oxides. FIG. 2b shows the substrate 21 following deposition of an intermediate "glue" or adhesion layer 22. The glue layer 22 may illustratively comprise Ti, Si, Cr, or Zr and serves to provide a surface for deposition of the amorphous silicon carbide to which the amorphous silicon carbide is more strongly binding. FIG. 2c shows the substrate following deposition of the amorphous silicon carbide layer 23 onto the glue layer 22.

The glue layer 22 may be of any suitable thickness, and may be formed by sputtering, CVD, or any other useful technique. In window and other optical applications of the present invention, the thickness of the glue layer must allow light passage through the film, and thicknesses on the order of approximately 250 Angstroms are usefully employed.

Figure 3:
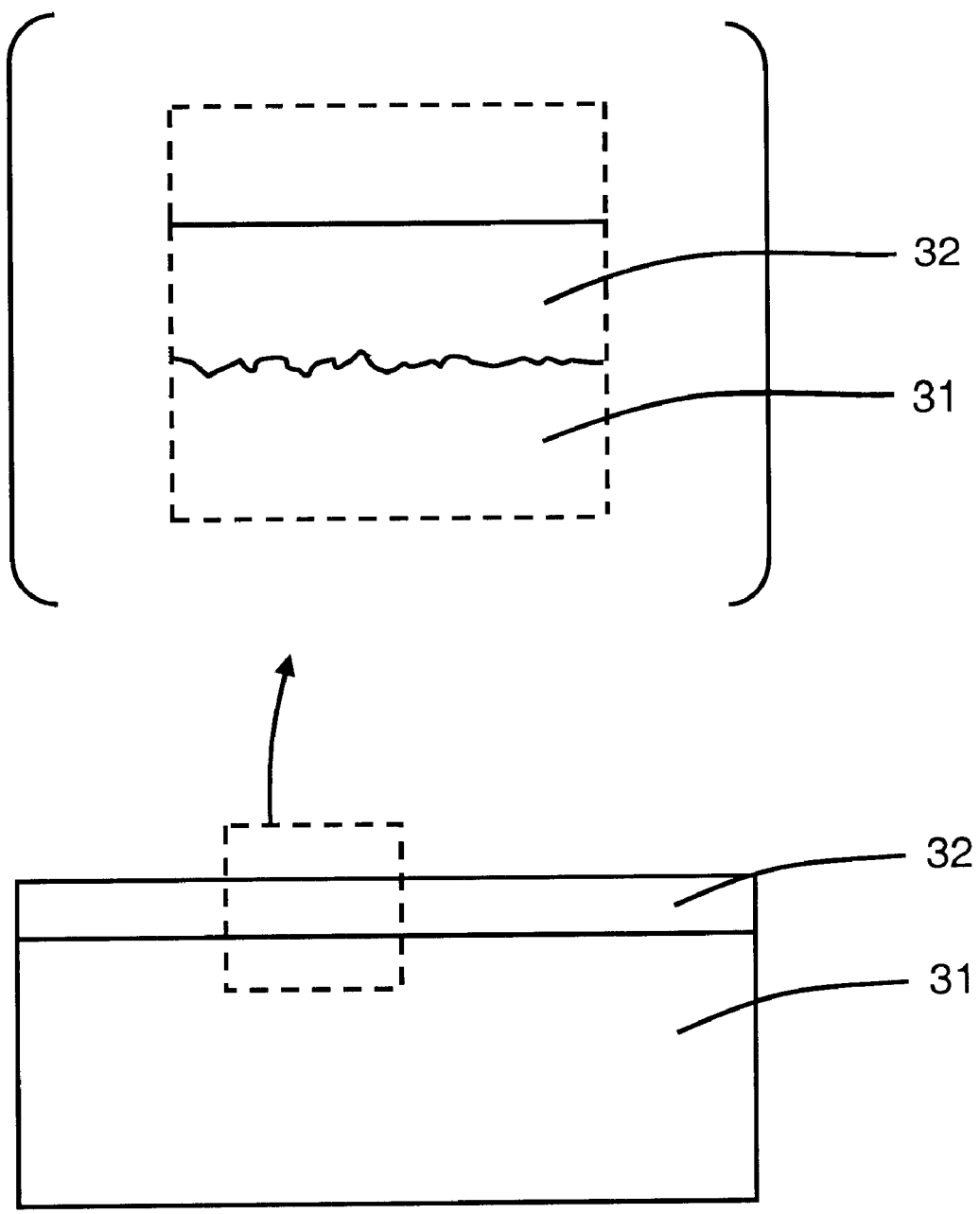
FIG. 3 is a schematic diagram depicting a smoothing-out effect of amorphous silicon carbide deposition, according to another embodiment of the present invention.

FIG. 3 schematically illustrates the smoothing-out of microscopic disparities on the surface of an IR window 31 with a sputtered deposited coating 32, whereby the root mean square roughness characteristic of the IR window surface may be substantially improved.

Figure 4A:
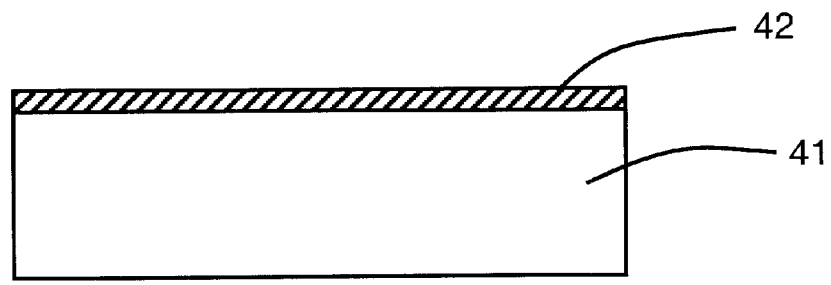
FIG. 4 is a schematic representation of various coated window shapes, according to additional embodiments of the present invention.
Figure 4B:
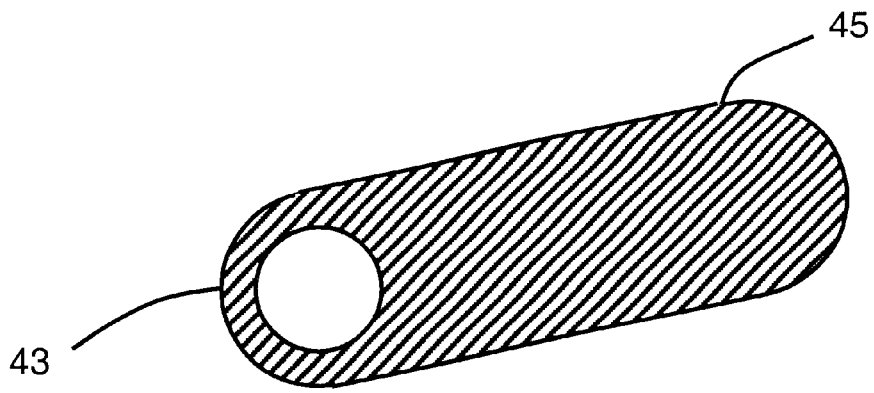
Figure 4C:
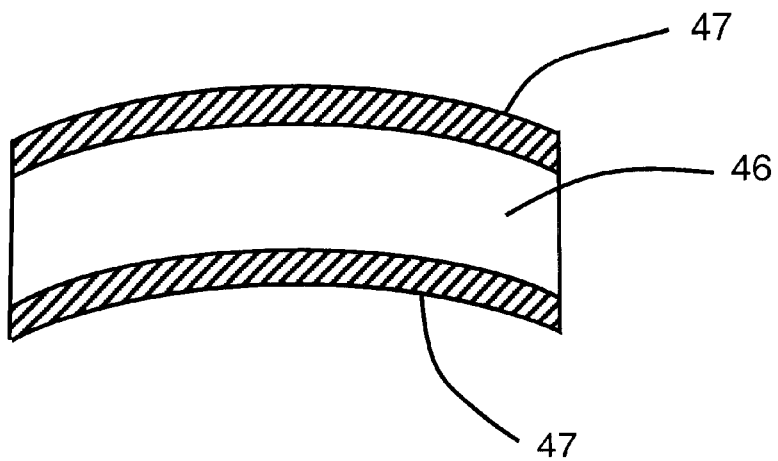

FIG. 4 illustrates various window shapes with an amorphous silicon carbide coating layer applied. FIG. 4a shows a planar window 41 with a protective amorphous silicon carbide coating 42 deposited on a single side thereof. FIG. 4b shows a cylindrically shaped window 43 with an amorphous silicon carbide coating 45 applied. FIG. 4c shows a curved IR window 46 with the amorphous silicon carbide coating 47 applied to both main surfaces of the window.

Figure 5A:
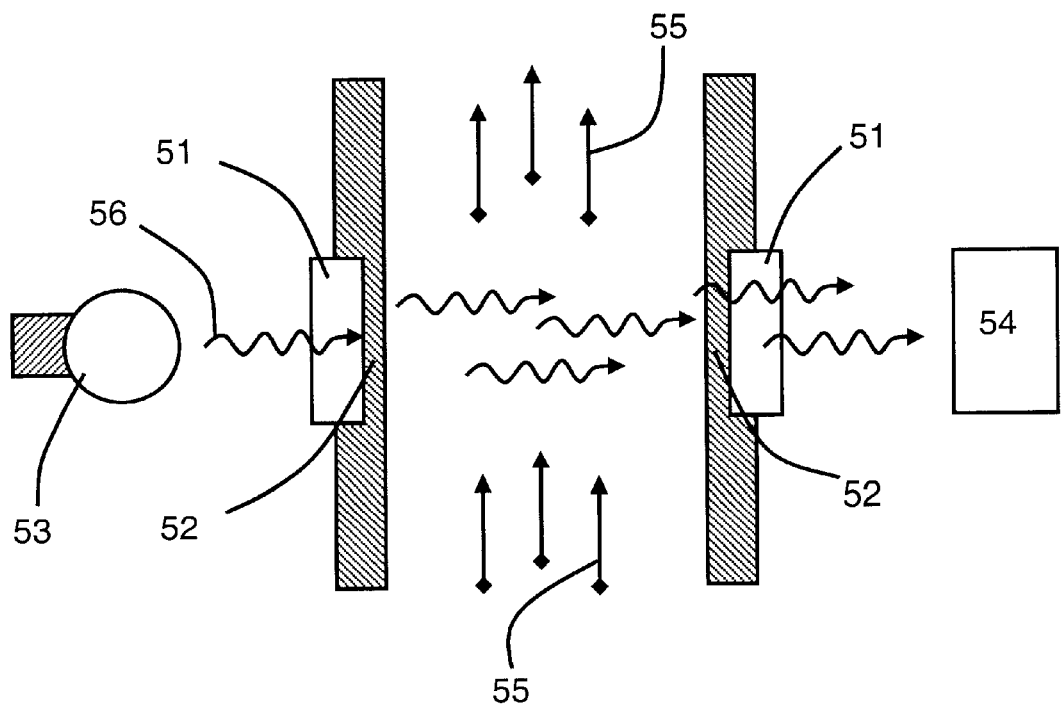
FIG. 5 is a schematic representation of two types of infrared process stream monitoring systems utilizing windows coated with thin films of amorphous silicon carbide.

FIG. 5 schematically illustrates representative systems employing the coated window. The system of FIG. 5a shows infrared windows 51 with amorphous silicon carbide coating 52 applied thereon. The windows are mounted on and sealed to a tubular flow passage housing containing process stream 55. Infrared photons 56 generated by light source 53 pass through the first IR window and into the process stream 55. Light that passes through the process stream is detected by detector 54, and analysis of the absorption spectra of the detected light is used to monitor and/or control the process stream 55, such as by means of a computer or microprocessor-based control system that responsively modulates an upstream process producing the process stream, to achieve a desired character of the process stream, or that controls the downstream use or disposition of the process stream.

Figure 5B:
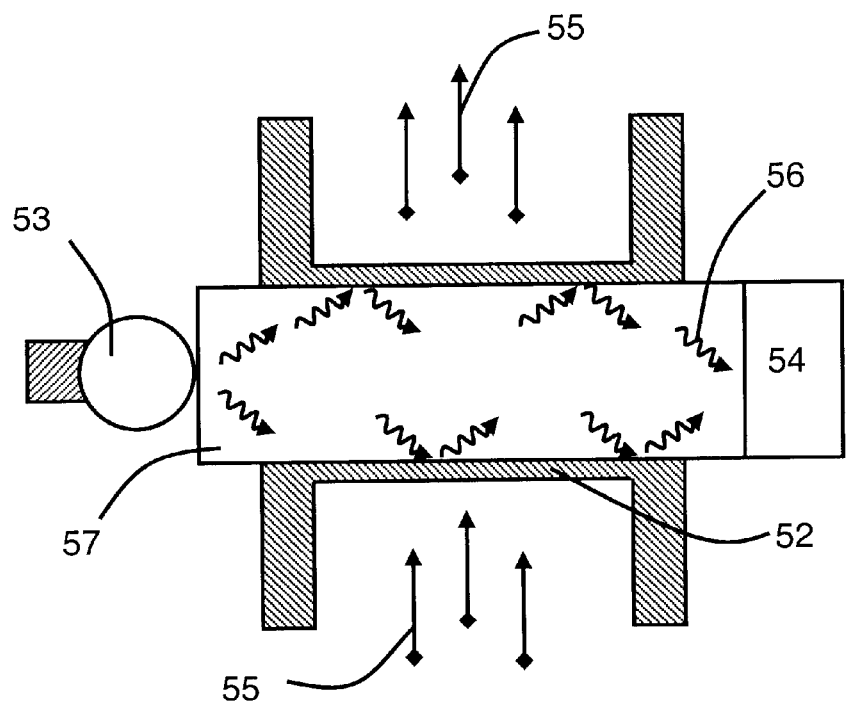

FIG. 5b depicts a system in which an infrared transparent tube 57 with amorphous silicon carbide coating 52 thereon extends transversely through an elongate tubular flow passage housing containing the process stream 55. Infrared photons 56, generated by light source 53, enter the tube 57. Infrared photons 56 can interact with the process stream 55. If the photon interactions with the process stream 55 result in light absorption, the fraction of light reaching infrared detector 54 is reduced. This absorption-induced change in intensity is used to monitor and/or control the process stream 55.

In another specific embodiment of the present invention, amorphous silicon carbide thin film coatings are applied to the protective domes covering infrared imaging and communications systems on airborne platforms. Deposition techniques and methodology are directly analogous to those described above with respect to infrared windows for process stream monitoring systems. Sputtering with a silicon carbide target is a preferred method of a-SiC film formation. Deposition at or below room temperature is preferred, to allow use of a wide variety of dome substrate materials of construction, such as soda lime glass.

In another embodiment of the present invention, amorphous silicon carbide thin films are applied to windows and powered to provide window heaters for defogging, deicing, etc. Amorphous SiC thin films are transparent to visible light; robust to changing environmental conditions; can be applied with a low-cost, repeatable deposition technique; and are tunable for resistivity within an appropriate range to take advantage of existing power sources.

Due to a wide band gap, SiC is optically transparent when deposited in amorphous form, as band tailing or midgap defect states are spread far enough apart that sufficient light passes through the film.

The resistivity of the a-SiC thin film can be tuned by introducing dopant (n- or p-type) electrical impurities, impurities that reduce (or increase) the number of defect states, or impurities that permit/promote the formation of a slightly different compound. Such impurities may, for example, comprise one or more selected from the group consisting of hydrogen, halogen, nitrogen, oxygen, sulfur, selenium, transition metals, boron, aluminum, phosphorus, gallium, arsenic, lithium, beryllium, sodium and magnesium. The resistivity of the heater coating is preferably in the range from about 10 mΩ cm to about 100 mΩ cm, and most preferably in the range from about 25 mΩ cm to about 50 mΩ cm.

Amorphous silicon carbide films are not highly reactive and are typically extremely hard (scratch-resistant). For example, a-SiC does not etch, or etches very slowly, in acid. The amorphous silicon carbide film can be deposited uniformly over large areas and at relatively low cost, particularly if the film is very thin. Varying the thickness and resistivity permits the use of typical voltage sources. DC to DC converters may be necessary in some applications to obtain a sufficiently high voltage for proper operation.

When large areas (i.e., the entire window) are coated, the resulting heater is less susceptible to scratch damage than current resistive wire window heaters. With large area coatings, the entire window is heated uniformly. Additionally, the a-SiC heater coating permits a 2-stage heating process comprising an initial high current with high generated temperatures to clear or de-ice a fogged or iced window, followed by a lower "maintenance current" to maintain the window in an optically clear condition. The power supply operatively coupled with the a-SiC film may therefore be constructed for corresponding "two-step" power operation.

In a further embodiment of the present invention, amorphous silicon carbide thin film coatings are applied to shield electronic components from electromagnetic interference, while providing a transparent path in the wavelengths of interest for optical signals. To be effective for EMI shielding, the coating must have a high enough resistivity to push the plasma resonance at which free carrier absorption becomes significant to wavelengths beyond the 3–5 micron operational window. At the same time, however, the film must remain conductive enough to enable adequate shielding. The plasma resonance $\lambda_p$ where free carrier absorption becomes significant can be calculated using equations based on Drude theory:

$$\lambda_P^2 = 4\pi^2 c^2 \varepsilon_1 \frac{\varepsilon_0 m^*}{Ne^2}$$

where N is the free carrier density, $\varepsilon_1$ is the high-frequency dielectric constant, and m* is the effective carrier mass. Lowering the free carrier density and hence the conductivity of the a-SiC, then, will serve to shift the plasma resonance to wavelengths longer than IR. This shift in plasma resonance wavelength, however, has an impact on RF shielding effectiveness. The equation describing shielding effectiveness of a thin (much thinner than skin depth) conductive layer against wavelengths longer than the plasma wavelength is:

$$SE = 20\log[1 + 188.5\sigma t]$$

where SE is shielding effectiveness in dB, σ is conductivity and t is layer thickness. For relatively thin films of ~5 μm and assuming a mobility of 10 cm$^2$/V$_S$, a film with a resistivity of 10 mΩ cm has a plasma resonance above 5 μm and a shielding effectiveness greater than 20 dB. If the mobility of the a-SiC can be further increased, the SE effectiveness increases substantially while the plasma wavelength remains unchanged.

The window coating requires a material that is transparent to light in the relative wavelength range, resistant to scratching, and readily deposited over large areas. A film resistivity of approximately 10–25 mΩ cm is required, with relatively high mobility.

The amorphous silicon carbide films of the present invention provide the necessary optical and electrical properties and otherwise are robust and easy to deposit. Low resistivity of the amorphous silicon carbide film is readily achieved by nitrogen doping and annealing in argon.

In another embodiment of the present invention, amorphous silicon carbide is used as a coating on micromachined silicon sensors, protecting the active sensor elements from exposure to harsh environments. Amorphous SiC in such applications is highly advantageous, as a consequence of its chemical inertness and mechanical strength, and the fact that a-SiC can be sputtered deposited, facilitating large area deposition and low cost. By adjusting the deposition conditions, low stress films of a-SiC can be produced on a variety of substrates and surfaces. Amorphous SiC in accordance with the present invention allows sensors to be used in harsh environments.

Amorphous silicon carbide is usefully employed in accordance with the present invention as a replacement material for silicon in micromachined sensors. Amorphous SiC has a larger band gap than does silicon, which reduces the thermally induced carrier generation rate by orders of magnitude. Hence, a-SiC does not suffer from the introduction of defects at temperatures up to 1000° C. Additionally, a-SiC has a relatively high Knoop hardness and a much larger bond strength than silicon, resulting in fewer thermally induced defects. Amorphous silicon carbide can be doped with n- and p-type dopants to provide desired electrical properties, it possesses a native oxide, and devices can be fabricated using conventional microelectronic techniques. The present invention enables the use of a-SiC in applications where general electrical control components and sensors need to function under widely varying environmental conditions.

The use of a-SiC permits on-chip integration of sensors with associated electronics. Temperature compensation, calibration, signal conditioning and interface functions, for example, can be co-located at the sensor. Integration of the sensor and electronics greatly improves sensor accuracy and reliability, and facilitates sensor incorporation into electronics systems. When the a-SiC sensor is formed on crystalline SiC, high performance control electronics can readily be fabricated.

Amorphous silicon carbide based high-temperature, harsh environment micromachined sensor devices in accordance with the present invention find use in the automotive, aircraft, defense, aerospace, oil and mining, and manufacturing industries. In aircraft and turbine powered generators, pressure sensors fabricated of amorphous silicon carbide are capable of withstanding the harsh environment of a gas turbine engine, to provide valuable information about the operating conditions of the engine during use. The amorphous silicon carbide pressure sensor devices of the invention may also be employed in the automotive industry, to increase fuel economy and safety and to reduce vehicle exhaust emissions.

Figure 6:
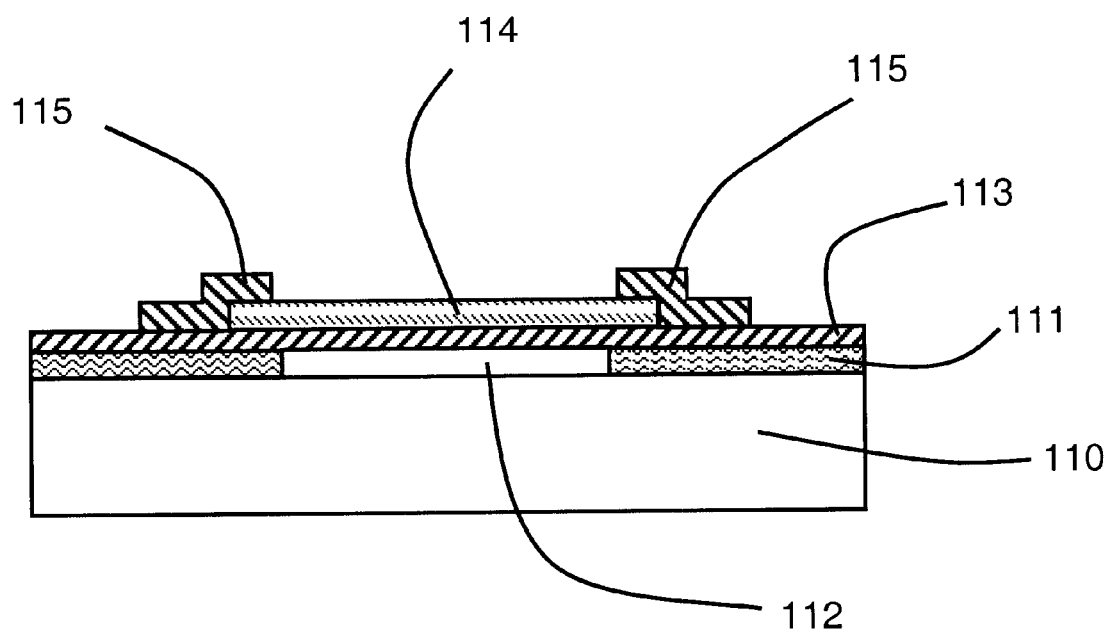
FIG. 6 is a schematic representation of a pressure sensor assembly, according to one embodiment of the present invention.

FIG. 6 is a schematic representation of a silicon carbide pressure sensor device according to one embodiment of the present invention. On substrate 110 is deposited a first highly resistive amorphous silicon carbide thin film 111 over the substrate top surface, with the exception of a reference cavity region. A second highly resistive amorphous silicon carbide thin film 113 is deposited over the first thin film 111, and also over the reference cavity region, forming a sealed reference cavity 112. A low resistivity amorphous silicon carbide thin film 114 is deposited over the second highly resistive amorphous silicon carbide thin film 113, over the region of sealed reference cavity 112. Nickel electrodes 115 are formed at the ends of low resistivity amorphous silicon carbide thin film 114. The device of FIG. 6 operates as a pressure sensor; the resistivity of a-SiC thin film 114 changes with the film strain.

Thus, changes in ambient pressure exerted on the film 114 are manifested as altered film strain characteristics that change the resistivity of the film and by coupling the FIG. 6 device to suitable circuitry to permit sensing of the resistivity change, a corresponding output can be effected for pressure monitoring purposes, e.g., to alter a process system in response to the pressure change.

In another embodiment of the present invention, amorphous silicon carbide thin films are used as diffusion barrier layers in VLSI electronic circuits. This aspect of the invention takes advantage of the stability and chemical inertness of amorphous silicon carbide and the fact that many elements conventionally used in integrated circuitry have a low diffusion rate in silicon carbide. The amorphous nature of the a-SiC barrier will further reduce the diffusion of metals beyond the inherent low diffusional rate, since a-SiC films have no grain boundaries, and diffusion along grain boundaries is generally faster than diffusion in bulk.

The amorphous silicon carbide diffusion barrier layer can be deposited by sputtering a silicon carbide target, or by reactively sputtering a silicon target in the presence of a hydrocarbon, or it can be deposited by chemical vapor deposition or in any other suitable manner.

The amorphous silicon carbide material used in various embodiments of the invention may be in the form of amorphous silicon carbide per se, or various alloy forms of amorphous silicon carbide may be employed, such as for example amorphous silicon carbide:nitride and amorphous silicon carbide:hydride alloys. In window and protective coating applications, corresponding amorphous carbide and amorphous carbide alloys can be employed, as well as amorphous gallium nitride and amorphous aluminum nitride.

The amorphous silicon carbide materials of the invention may be formed with desired resistivity characteristics by doping with suitable dopant species, e.g., nitrogen, boron, phosphorus, aluminum or arsenic, to produce an amorphous silicon carbide material with suitable electrical properties for a given end use application.

The features and advantages of the invention are more fully shown with respect to the following illustrative examples.

EXAMPLE 1

An infrared analyzer of the type depicted in FIG. 5b is arranged to continuously monitor organic and some inorganic components in a liquid process stream. Infrared light is generated (1–20 μm), passed through a cubic zirconium cylinder (internally reflected along the length), and focused onto detectors. The process stream solution on the cylinder surface absorbs at specific wavelengths and a reduction in signal intensity is detected and compared to the signal intensity for a reference solution or to the signal intensity at a wavelength where no absorption takes place. The cubic zirconium rod requires a protective coating that is robust, does not readily delaminate, and is chemically inert under the following conditions:

1–2% citric or phosphoric at or below room temperature 100 ppm sodium hypochlorite at or below room temperature 1–2% caustic soda and/or detergent at room temperature to 85° C.

1–2% phosphoric acid and/or detergent at room temperature to 85° C.

The cubic zirconium rod was coated with amorphous silicon carbide. The surface of the rod was smoothed considerably. SEM images at 10K magnification prior to the a-SiC deposition showed a rough surface morphology. After deposition of a-SiC film, a scan at 20K magnification appeared flat.

EXAMPLE 2

Amorphous silicon carbide was deposited by sputtering a β-SiC target. The sputtering process is scalable up to large dimension substrates. Additionally, a low resistivity a-SiC film was produced by nitrogen doping and activation at higher temperatures. A low resistivity of 50 mΩ cm was obtained for nitrogen-doped amorphous silicon carbide films. The films were deposited in a Perkin-Elmer 4450 production sputter system using a β-SiC target under a condition of 1000 W magnetron power, 480 sccm argon flow, 16 mTorr argon pressure, and $6\times10^{-6}$ Torr nitrogen partial pressure. The low-resistivity films were activated by annealing in argon at 1100° C. for several minutes.

The present invention extends to and encompasses other features, modifications, and alternative embodiments, as will readily suggest themselves to those of ordinary skill in the art based on the disclosure and illustrative teachings herein. The claims that follow are therefore to be construed and interpreted as including all such features, modifications and alternative embodiments, within their spirit and scope.

What is claimed is:

1. A window assembly, comprising:
    a window; and
    an optically transparent thin film of amorphous silicon carbide on a surface of said window, wherein the optically transparent thin film has a resistivity in a range of from about 10 mΩ cm to about 100 mΩ cm.

2. The window assembly of claim 1, wherein the thin film has been deposited on the window by a process selected from the group consisting of chemical vapor deposition, plasma enhanced chemical vapor deposition, RF glow discharge, RF sputtering, ion cluster beam deposition, ion beam sputtering, sol gel coating, reactive sputtering, plasma spray, reactant spraying, microwave discharge, and photo CVD.

3. The window assembly of claim 1, wherein the thin film has a thickness in the range from about 0.025 micron to about 10 microns.

4. The window assembly of claim 1, wherein the thin film has a thickness in the range from about 0.05 micron to about 1.0 micron.

5. The window assembly of claim 1, wherein the thin film has a thickness in the range from about 0.1 micron to about 0.5 micron.

6. The window assembly of claim 1, wherein the window comprises an isolation dome constructed and arranged to protect optical or opto-electronic sources or sensors.

7. A window assembly, comprising:
    a window;
    an optically transparent and electrically conductive thin film of amorphous silicon carbide deposited on a surface of said window; and
    a power supply operatively coupled to the thin film, and selectively actuatable so that the power supply when actuated causes an electrical current to flow through the thin film to generate heat, whereby the window may be selectively defogged or de-iced.

8. The window assembly of claim 7, wherein the thin film has been deposited on the window by sputtering.

9. The window assembly of claim 7, wherein the thin film is doped with a dopant species comprising a material selected from the group consisting of hydrogen, halogen, nitrogen, oxygen, sulfur, selenium, transition metals, boron, aluminum, phosphorus, gallium, arsenic, lithium, beryllium, sodium and magnesium.

10. The window assembly of claim 1, wherein the optically transparent thin film has a resistivity in the range from about 25 mΩ cm to about 50 mΩ cm.

* * * * *